(12) United States Patent
Acharya

(10) Patent No.: US 6,751,640 B1
(45) Date of Patent: Jun. 15, 2004

(54) METHOD AND APPARATUS FOR MULTIPLY-ACCUMULATE TWO-DIMENSIONAL SEPARABLE SYMMETRIC FILTERING

(75) Inventor: Tinku Acharya, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 645 days.

(21) Appl. No.: 09/718,877

(22) Filed: Nov. 20, 2000

(51) Int. Cl.⁷ .............................................. G06F 17/10
(52) U.S. Cl. ...................................... 708/300; 708/308
(58) Field of Search ................................ 708/300, 308, 708/316, 319; 382/260, 264, 277

(56) References Cited

U.S. PATENT DOCUMENTS 4,817,180 A * 3/1989 Cho et al. ................... 382/264
6,015,385 A * 1/2000 Finger et al. ................ 600/443
6,304,679 B1 * 10/2001 Clingerman et al. ........ 382/277
6,530,010 B1 * 3/2003 Hung et al. .................... 712/1

* cited by examiner

Primary Examiner—Chuong Dinh Ngo
(74) Attorney, Agent, or Firm—Marger Johnson & McCollom, P.C.

(57) ABSTRACT

An architecture for a multiply and accumulate two-dimensional separable symmetric filter. The architecture includes a binary tree adder producing sums of samples of an incoming signal. A multiplier then multiplies sums from the binary tree adder with filter coefficients producing filtered products. An accumulation adder to sums the filtered products and produce a filtered output.

15 Claims, 2 Drawing Sheets

METHOD AND APPARATUS FOR MULTIPLY-ACCUMULATE TWO-DIMENSIONAL SEPARABLE SYMMETRIC FILTERING

BACKGROUND

1. Field

This disclosure relates to symmetric digital filtering, more particularly to a method for determining optimal performance of two-dimensional symmetric filtering.

2. Background

The use of digital image data is prevalent. Printing applications, such as making copies, receiving faxes, printing documents, including all kinds of text, graphics and photographs, typically use digital image data. An original image is scanned or image data is provided from a computer, as in computer generated documents. The resulting data is typically a number of data elements, each data element representing a picture element (pixel) of the original image.

The size of the data element depends upon the resolution of the system. A typical printing resolution is 600 dots per inch, where each dot is the equivalent of a pixel. Digital video may have 24 bits per pixel, 8 bits each in red, green and blue. Regardless of how the data is generated, or the resolution in which it is stored, the image data is now in a format that can be manipulated to enhance the quality of the resulting image. The resulting image can be created as a printed image or as a displayed image.

The manipulation of the data can happen through one of several methods. One such method is to apply a filter to the data. Filtering in this instance normally means altering the data values by multiplying or adding some predetermined value to each data element in an image, where the data elements typically correspond to the pixels of the final image. For example, digital image data destined for print applications may have a filter known as a blue noise mask applied to it. The blue noise mask values serve to disrupt any regional patterns in the data that can cause undesirable artifacts in the final image. Two-dimensional digital filtering is used for many other imaging applications such as image enhancement, scaling, and segmentation to name a few but not limited by these applications only.

Image data typically has a native two-dimensional format, having both horizontal and vertical dimensions like the image that data represents. Filtering can be applied in one-dimension, the results stored, and then in the other dimension. This two-step process can be relatively slow, impractical for high-speed printing or real-time display and may require extra intermediate data storage. An alternate approach applies two-dimensional filters, speeding up the process. However, two-dimensional filters require extra hardware to allow for as much parallel processing as possible to take advantage of working in two dimensions simultaneously. A need exists for a technique that provides a fast computation of two-dimensional separable symmetric filtering.

BRIEF DESCRIPTION OF THE DRAWINGS

The invention may be best understood by reading the disclosure with reference to the drawings, wherein:

FIG. 3 shows a flowchart of one embodiment of a method to implement a two-dimensional separable symmetric filter, in accordance with the invention.

DETAILED DESCRIPTION OF THE EMBODIMENTS

Figure 1:
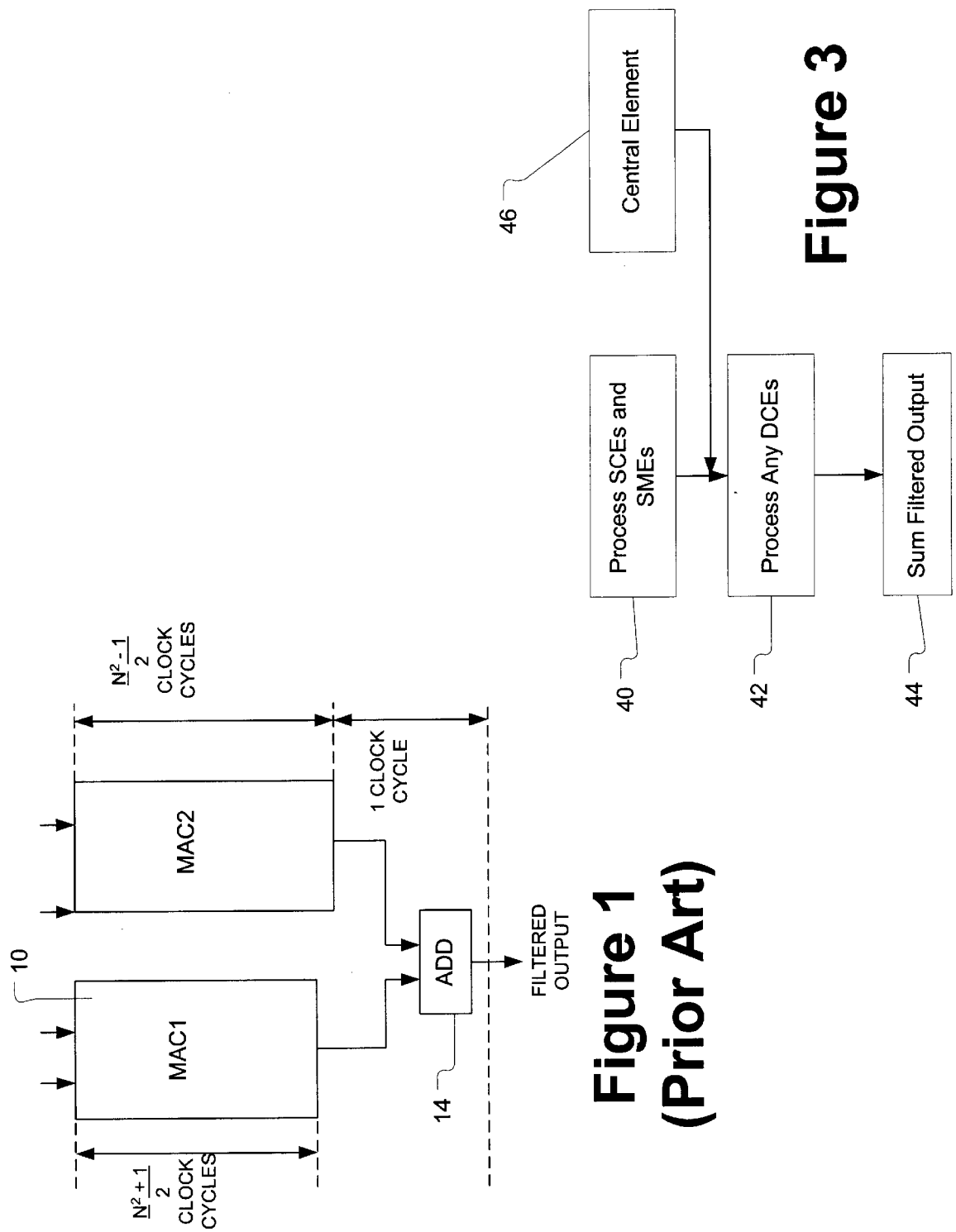
FIG. 1 shows one embodiment of a two-dimensional separable symmetric filter, in accordance with the invention.

As discussed previously, many digital filtering applications apply one-dimensional (1D) filters. These filters are typically embodied as a series of coefficients used to multiply with the incoming signals. Examples of 3-tap, 5-tap, 7-tap and N-tap filter coefficients (assuming N=2M+1, where M is a positive integer), with the coefficients designated as variables, are shown below:

$$F_3 = [\,a\ b\ c\,]$$
$$F_5 = [\,a\ b\ c\ b\ a\,]$$
$$F_7 = [\,a\ b\ c\ d\ c\ b\ a\,].$$
$$F_N = [\,F_M\ F_{M-1}\ \ldots\ F_2\ F_1\ F_0\ F_1\ F_2 \ldots F_{M-1}\ F_M\,].$$

Corresponding two-dimensional (2D) separable filters can be derived from these coefficients, as examples, below. The two-dimensional kernel for 3×3 separable symmetric filtering can be derived as
where $$F_{3\times 3} = \begin{bmatrix} a \\ b \\ a \end{bmatrix} * [\,a\ b\ a\,] = \begin{bmatrix} a^2 & ab & a^2 \\ ab & b^2 & ab \\ a^2 & ab & a^2 \end{bmatrix} = \begin{bmatrix} x & y & x \\ y & z & y \\ x & y & x \end{bmatrix}$$

Hence, the above 3×3 separable symmetric digital filter has 3 distinct filter coefficients x, y and z. If there is a two dimensional signal (S) of size M×N, the filtering operation can be represented as follows:

$$Y = S \otimes F_{3\times 3},$$

where Y is the output signal after filtering input signal S by above 3×3 separable symmetric digital filter.

$$Y = \begin{bmatrix} y_{0,0} & y_{0,1} & \cdot & \cdots & \cdot & \cdot & y_{0,N-1} \\ y_{1,0} & \cdot & \cdot & \cdot & \cdot & \cdot & \cdot \\ \cdot & \cdot & \cdot & \cdot & \cdot & \cdot & \cdot \\ \vdots & \cdot & \cdot & y_{i,j} & \cdot & \cdot & \vdots \\ \cdot & \cdot & \cdot & \cdot & \cdot & \cdot & \cdot \\ \cdot & \cdot & \cdot & \cdot & \cdot & \cdot & \cdot \\ y_{M-1,0} & y_{M-1,1} & \cdot & \cdots & \cdot & \cdot & y_{M-1,N-1} \end{bmatrix},$$

$$S = \begin{bmatrix} s_{0,0} & s_{0,1} & \cdot & \cdots & \cdot & \cdot & s_{0,N-1} \\ s_{1,0} & \cdot & \cdot & \cdot & \cdot & \cdot & s_{1,N-1} \\ \cdot & \cdot & s_{i-1,j-1} & s_{i-1,j} & s_{i-j,j+1} & \cdot & \cdot \\ \vdots & \cdot & s_{i,j-1} & s_{i,j} & s_{i,j+1} & \cdot & \cdot \\ \cdot & \cdot & s_{i+1,j-1} & s_{i+1,j} & s_{i+1,j+1} & \cdot & \cdot \\ \cdot & \cdot & \cdot & \cdot & \cdot & \cdot & \cdot \\ s_{M-1,0} & s_{M-1,1} & \cdot & \cdots & \cdot & \cdot & s_{M-1,N-1} \end{bmatrix}$$

An output signal sample $y_{i,j}$ can be represented as follows:

$$y_{i,j} = s_{i-1,j-1}*x + s_{i-1,j}*y + s_{i-1,j+1}*x + s_{i,j-1}*y + s_{i,j}*z + s_{i,j+1}*y + s_{i+1,j-1}*x + s_{i+1,j}*y + s_{i+1,j+1}*x$$

or $y_{i,j} = (s_{i-1,j-1} + s_{i-1,j+1} + s_{i+1,j-1} + s_{i+1,j+1})*x + (s_{i-1,j} + s_{i,j-1} + s_{i,j+1} + s_{i+1,j+1})*y + s_{i,j}*z$

Other kernel examples for 3×3, 5×5, 7×7 and 9×9 separable filters are shown below.

$$F_{3\times3} = \begin{bmatrix} x & y & x \\ y & z & y \\ x & y & x \end{bmatrix}, F_{5\times5} = \begin{bmatrix} x & y & z & y & x \\ y & u & v & u & y \\ z & v & w & v & z \\ y & u & v & u & y \\ x & y & z & y & x \end{bmatrix},$$

$$F_{7\times7} = \begin{bmatrix} x & y & z & w & z & y & x \\ y & v & u & t & u & v & y \\ z & u & s & r & s & u & z \\ w & t & r & q & r & t & w \\ z & u & s & r & s & u & z \\ y & v & u & t & u & v & y \\ x & y & z & w & z & y & x \end{bmatrix}, F_{9\times9} = \begin{bmatrix} a & b & c & d & e & d & c & b & a \\ b & x & y & z & w & z & y & x & b \\ c & y & v & u & t & u & v & y & c \\ d & z & u & s & r & s & u & z & d \\ e & w & t & r & q & r & t & w & e \\ d & z & u & s & r & s & u & z & d \\ c & y & v & u & t & u & v & y & c \\ b & x & y & z & w & z & y & x & b \\ a & b & c & d & e & d & c & b & a \end{bmatrix}$$

The same kernels can be derived for higher size kernels of any size N×N, where N is an odd integer. As an example, the mathematical expression for the filtered output $y_{i,j}$ for a 9×9 filter is shown below.

$y_{i,j} = s_{i,j}*$ $q + (s_{i-4,j-4} + s_{i-4,j+4} + s_{i+4,j-4} + s_{i+4,j+4})*$ $a + (s_{i-3,j-3} + s_{i-3,j+3} + s_{i+3,j-3} + s_{i+3,j+3})*$ $x + (s_{i-2,j-2} + s_{i-2,j+2} + s_{i+2,j-2} + s_{i+2,j+2})*$ $v + (s_{i-1,j-1} + s_{i-1,j+1} + s_{i+1,j-1} + s_{i+1,j+1})*$ $s + (s_{i-4,j} + s_{i+4,j} + s_{i,j-4} + s_{i,j+4})*$ $e + (s_{i-3,j} + s_{i+3,j} + s_{i,j-3} + s_{i,j+3})*$ $w + (s_{i-2,j} + s_{i+2,j} + s_{i,j-2} + s_{i,j+2})*$ $t + (s_{i-1,j} + s_{i+1,j} + s_{i,j-1} + s_{i,j+1})*$ $r + (s_{i-4,j-3} + s_{i-4,j+3} + s_{i-3,j-4}$
$+ s_{i-3,j+4} + s_{i+3,j-4} + s_{i+3,j+4} + s_{i+4,j-3} + s_{i+4,j+3})*$ $b + (s_{i-3,j-2} + s_{i-3,j+2} + s_{i-2,j-3}$
$+ s_{i-2,j+3} + s_{i+2,j-3} + s_{i+2,j+3} + s_{i+3,j-2} + s_{i+3,j+2})*$ $y + (s_{i-2,j-1} + s_{i-2,j+1} + s_{i-1,j-2}$
$+ s_{i-1,j+2} + s_{i+1,j-2} + s_{i+1,j+2} + s_{i+2,j-1} + s_{i+2,j+1})*$ $u + (s_{i-4,j-2} + s_{i-4,j+2} + s_{i-2,j-4}$
$+ s_{i-2,j+4} + s_{i+2,j-4} + s_{i+2,j+4} + s_{i+4,j-2} + s_{i+4,j+2})*$ $c + (s_{i-3,j-1} + s_{i-3,j+1} + s_{i-1,j-3} + s_{i-1,j+3} + s_{i+1,j-3}$
$+ s_{i+1,j+3} + s_{i+3,j-1} + s_{i+3,j+1})*$ $z + (s_{i-4,j-1} + s_{i-4,j+1} + s_{i-1,j-4} + s_{i-1,j+4} + s_{i+1,j-4}$
$+ s_{i+1,j+4} + s_{i+4,j-1} + s_{i+4,j+1})*d +$

From this expression, it can be seen that 8 addition operations need to be performed, each with 4-input additions, and 6 addition operations, each with 8-input additions. These sums are then multiplied by the corresponding filter coefficients. The products can then be accumulated to produce a final result.

Parallel processing can be exploited to achieve fast computation if there are sufficient number of hardware resources. The hardware resources typically take the form of adders and multipliers that can be shared for execution at different clock cycles. It is helpful to first characterize the incoming signal S samples in order to allocate them to the appropriate computation modules of adders and multipliers.

Looking at the 2-D N×N filter kernel carefully, it can be decomposed into $$\frac{N-1}{2}$$

squares and the central coefficient. Such a decomposition is shown below with example of $F_{7\times7}$ which will have 3 squares and the center element (q).

$$F_{7\times7} = \begin{bmatrix} . & . & . & . & . & . & . \\ . & . & . & . & . & . & . \\ . & . & s & r & s & . & . \\ . & . & r & . & r & . & . \\ . & . & s & r & s & . & . \\ . & . & . & . & . & . & . \\ . & . & . & . & . & . & . \end{bmatrix} + \begin{bmatrix} . & . & . & . & . & . & . \\ . & v & u & t & u & v & . \\ . & u & . & . & . & u & . \\ . & t & . & . & . & t & . \\ . & u & . & . & . & u & . \\ . & v & u & t & u & v & . \\ . & . & . & . & . & . & . \end{bmatrix} +$$

$$\begin{bmatrix} x & y & z & w & z & y & x \\ y & . & . & . & . & . & y \\ z & . & . & . & . & . & z \\ w & . & . & . & . & . & w \\ z & . & . & . & . & . & z \\ y & . & . & . & . & . & y \\ x & y & z & w & z & y & x \end{bmatrix} + \begin{bmatrix} . & . & . & . & . & . & . \\ . & . & . & . & . & . & . \\ . & . & . & . & . & . & . \\ . & . & . & q & . & . & . \\ . & . & . & . & . & . & . \\ . & . & . & . & . & . & . \\ . & . & . & . & . & . & . \end{bmatrix}$$

Reviewing the squares above, it is possible to decompose the array into several different components.

The four corner elements in each square are always identical and hence the corresponding four samples in signal S can be added and multiplied with that coefficient. These samples will be referred to as "SCE" to represent Square Corner Elements. For example, $\{s_{i-3,j-3}, s_{i-3,j+3}, s_{i+3,j-3}, s_{i+3,j+3}\}$ are the SCEs corresponding to the third square in $F_{7\times7}$ and hence these samples can be added together and multiplied by the corresponding filter coefficient x in the third square to produce $(s_{i-3,j-3} + s_{i-3,j+3} + s_{i+3,j-3} + s_{i+3,j+3})*x$. Similarly, $(s_{i-2,j-2} + s_{i-2,j+2} + s_{i+2,j-2} + s_{i+2,j+2})*v$ $(s_{i-1,j-1} + s_{i-1,j+1} + s_{i+1,j-1} + s_{i+1,j+1})*s$ corresponds to the second and first squares in $F_{7\times7}$.

Similarly, the four middle elements in all the four edges in a square are the same. These will be referred to as corresponding samples of signal S as "SME" to represent Square Middle Elements. For example, $\{s_{i-3,j}, s_{i,j-3}, s_{i+3,j}, s_{i,j+3}\}$ are the SMEs corresponding to the third square in $F_{7\times7}$ and hence these samples can be added together and multiplied by the corresponding filter coefficient w in the third square to produce $(s_{i-3,j} + s_{i,j-3} + s_{i+3,j} + s_{i,j+3})*w$. Similarly, $(s_{i-2,j} + s_{i,j-2} + s_{i+2,j} + s_{i,j+2})*t$ and $(s_{i-1,j} + s_{i,j-1} + s_{i+1,j} + s_{i,j+1})*r$ corresponds to the second and first squares in $F_{7\times7}$.

There are one SCE and one SME for each square. Therefore, there are $$\frac{N-1}{2}$$

SCE's and $$\frac{N-1}{2}$$

SME's for an N×N filter. Each SCE or SME needs a 4-input adder. Hence, the filter needs a total N−1 number of 4-input adders and N−1 multipliers to implement SCE's and SME's.

In the 7×7 example above, there are eight identical elements in the filter, which are all unit distant from the nearest corner element. For example, all the elements y are away by unit distance from the corner element x in the first square. These could be referred to as "D1CE" to represent Distance One from Corner Elements. Input samples $\{s_{i-3,j-2}, s_{i-2,j-3}, s_{i+2,j-3}, s_{i+3,j-2}, s_{i+3,j+2}, s_{i+2,j+3}, s_{i-2,j+3}, s_{i-3,j+2}\}$ are the D1CEs corresponding to the third square in $F_{7\times7}$ and hence, these samples can be added together and multiplied by the corresponding filter coefficient y in the third square to produce $(s_{i-3,j-2}+s_{i-2,j-3}+s_{i+2,j-3}+s_{i+3,j-2}+s_{i+3,j+2}+s_{i+2,j+3}+s_{i-2,j+3}+s_{i-3,j+2})*y$. Similarly, $(s_{i-2,j-1}+s_{i-1,j-2}+s_{i+1,j-2}+s_{i+2,j-1}+s_{i+2,j+1}+s_{i+1,j+2}+s_{i-2,j+1}+s_{i-1,j+2})*u$ corresponds to the second square in $F_{7\times7}$. This one does not exist in the first square. Hence, there are a total of 2 D1CE's in 7×7 filtering.

However, the definition of D1CEs can be expanded to any element that is a unit distance from the square corner elements (SCEs). In general, a "DkCE' may be defined to represent Distance k from Corner Elements, referred to as distance corner elements. For example, $\{s_{i-3,j-1}, s_{i-1,j-3}, s_{i+1,j-3}, s_{i+3,j-1}, s_{i+1,j+3}, s_{i-1,j+3}, s_{i-3,j+1}\}$ are the D2CEs corresponding to the third square in $F_{7\times7}$ and hence, these samples can be added together and multiplied by the corresponding filter coefficient z in the third square to produce $(s_{i-3,j-1}+s_{i-1,j-3}+s_{i+1,j-3}+s_{i+3,j-1}+s_{i+3,j+1}+s_{i+1,j+3}+s_{i-1,j+3}+s_{i-3,j+1})*z$. This one does not exist in second and third squares. Hence there are 1 D2CE in 7×7 filtering.

There are total 1+2=3 DkCEs in 7×7 filtering. After working out in the similar fashion, it can be seen that there will be total 1+2+3=6 DkCE's in a 9×9 filter. In general there will be $$1+2+...+\frac{N-3}{2} = \frac{(N-1)(N-3)}{8}$$

DkDE's in an N×N filter. To implement DkCEs, that many 8-input addition operations are needed.

Using a traditional multiply-accumulate (MAC) approach, a single MAC digital signal processor (DSP) architecture requires $N^2$ clock cycles to compute a filtered output for each sample of the incoming signal. Using multiple MAC processors, the operation can be parallelized and the clocking requirements can accordingly be reduced. An example of a dual MAC architecture timing diagram is shown in FIG. 1.

In this example, two MAC DSPs are used. The $N^2$ clock cycles can be divided into two streams, one of length $$\frac{N^2+1}{2}$$

and the other of length $$\frac{N^2-1}{2},$$

because $N^2$ is an odd number. The first MAC1 10 can multiply and accumulate samples $$\frac{N^2+1}{2}$$

clock cycles. The second MAC2 12 can multiply and accumulate the other $$\frac{N^2-1}{2}$$

samples in $$\frac{N^2-1}{2}$$

clock cycles. These results are then summed in one clock cycle. The total clocking required is the longer period $$\frac{N^2+1}{2}$$

of the two processing cycles performed in parallel, plus one clock cycle, or $$\frac{N^2+1}{2}+1 = \frac{N^2+3}{2}.$$

However, the latency of this type of processing is still relatively high for typical high-speed printing or other real-time digital imaging applications. This can be reduced by exploiting the symmetric nature of the filter coefficients in the 2-D kernels shown above. Application of a split-multiplier binary tree adder input dual MAC architecture could also reduce the number of required clock cycles. A binary tree is an architecture where each node of the architecture has only two child nodes. A node could be a processor, adder, multiplier, etc.

Figure 2:
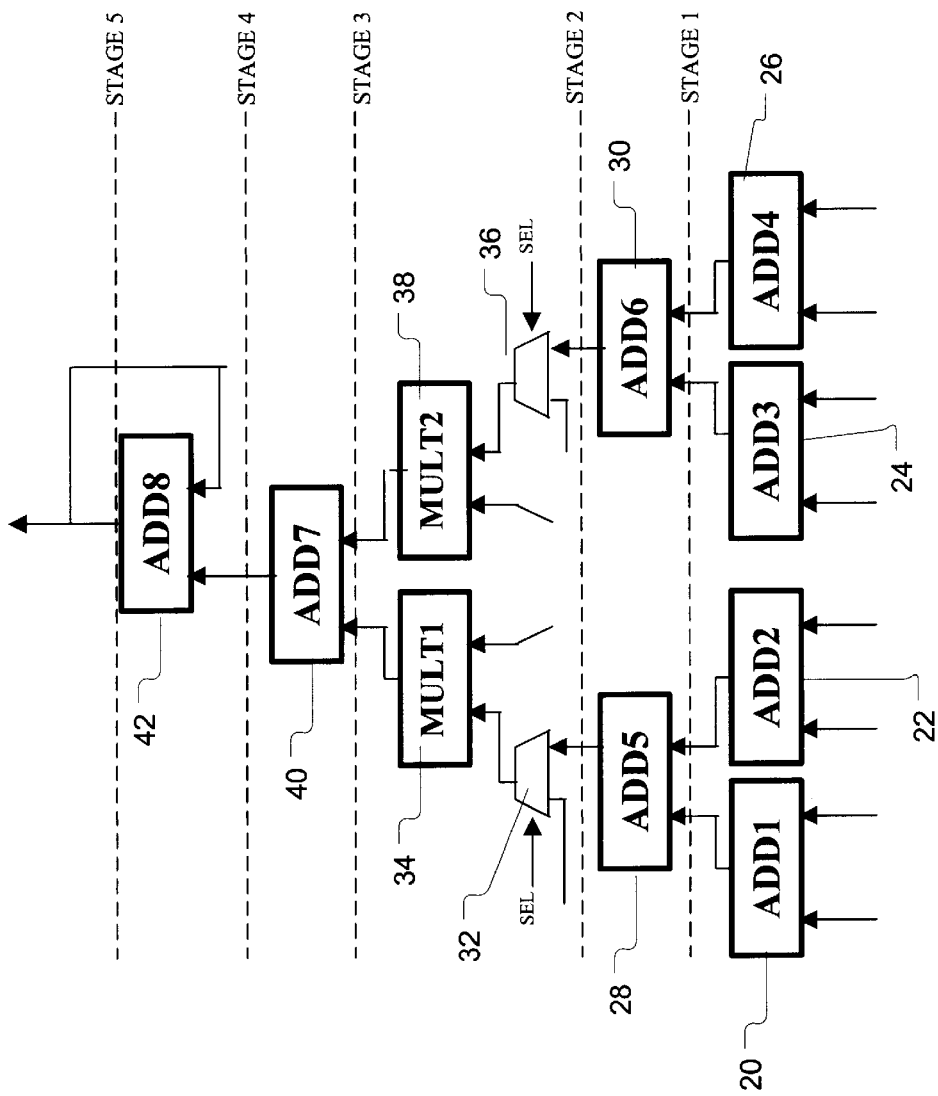
FIG. 2 shows an alternate embodiment of a two-dimensional separable symmetric filter, in accordance with the invention.

For example, in the architecture of FIG. 2, ADD5 28 is a node of the architecture. It has two child nodes ADD1 20 and ADD2 22. In the example architecture of FIG. 2, a 5×5 filter can be computed in 5 stages for a total of 7 clock cycles. Using the previous formula, this would normally take (25+3)/2, or 14 clock cycles.

The architecture works in pipelined fashion. The output results from ADD1 20 and ADD2 22 are input to ADD5 28 and similarly the output results from ADD3 and ADD4 are input to ADD6 30. The two multipliers MULT1 34 and MULT2 38 have two inputs each. One input is the filtering coefficient and the other input is the output from the corresponding multiplexer, 32 and 36, respectively. The output of the multiplexer depends upon the control signal SEL. If SEL=1, the multiplexer selects the output of ADD5 (or ADD6) to the input of MULT1 (or MULT2). If SEL=0, the multiplexer selects external input as shown by the left input signal. As will be discussed further, the external input signal may be the center filter coefficient and the sample $s_{i,j}$, or a zero (0).

In the example architecture of FIG. 2, there are five stages. After 5 clock cycles, all the stages will be active. As will be discussed for the 5×5 example, after the first four clock cycles the product $s_{i,j}*q$ will be accumulated in ADD8 42. In each subsequent clock cycle, each product in the expression for $y_{i,j}$ will be accumulated. Therefore, $$\frac{N-1}{2}$$

clock cycles are necessary to compute all the 4-input addition operations for the SME and SCE elements, and the coefficient multiplication. Also, $$\frac{(N-1)(N-3)}{8}$$

clock cycles are necessary to compute all the 8-input addition operations for the distance corner elements and perform the multiplication by the filter coefficient. The total number of clock cycles is the sum of the initial 4 clock cycles, the number of clock cycles to process the SME and SCE elements, and the number of clock cycles to process the distance corner elements, or $$\frac{(N-1)(N-3)}{8} + \frac{N-1}{2} + 4 = \frac{N^2+31}{8}.$$

In the case of the 5×5 example, the total number of clock cycles is 7.

This can be seen from FIG. 2. In stage 1, one clock cycle is used to perform the initial addition of elements for the SCEs corresponding to the first square in the 5×5 filter kernel. These may be allocated to the inputs of ADD1 20 and ADD2 22. At the same time, the four input samples corresponding to the first SMEs of the 5×5 kernel may be allocated to the inputs of ADD3 24 and ADD4 26. The four incoming input SCE signals are added in two clock cycles. The result is then multiplied by the corresponding filter coefficient by the multiplier MULT1 or MULT2 in the third clock cycle.

In the second clock cycle, the samples corresponding to the second SCE can be allocated to ADD1 20 and ADD2 22 and the input samples corresponding to the second SME can be allocated to ADD3 24 and ADD4 26 respectively. The result is then multiplied in fourth clock cycle.

This is continued for other SCE and SME elements as well. Therefore, SCE and SME elements are allocated in the input of ADD1, ADD2, ADD3, ADD4 of stage 1 as shown in FIG. 2 in first $$\frac{N-1}{2}$$

clock cycles because there are $$\frac{N-1}{2}$$

SCE and $$\frac{N-1}{2}$$

SME elements in a 2-D N×N filtering kernel. Each sum is then multiplied by the corresponding filter coefficient by either multiplier MULT1 22 or MULT2 24. The output from MULT1 and MULT2 are added by the 2-input adder ADD7 40 in the next clock cycle and accumulated by the adder ADD8 42 in the following clock cycle.

It should be noted that during processing of the SCE and SME elements, one of the input in MULT1 is the filter coefficient corresponding to the SCE and one of the input in MULT2 is the filter coefficient corresponding to SME. The filter coefficients are allocated to the input of MULT1 or MULT2 two clock cycles after the SCE and SME input signals are allocated to the input of ADD1, ADD2, ADD3 and ADD4.

After all the SCE and SME elements are processed, 8 input signals corresponding to first D1CE are allocated to the input of adders ADD1, ADD2, ADD3 and ADD4. The processing is similar to the processing of SCE and SME processing with the filter coefficient input to both MULT1 and MULT2 are the same. While DkCE elements are processed, same filter coefficient is input to both MULT1 and MULT2. As a result the output of ADD7 is essentially the sum of the D1CE elements multiplied by the corresponding filter coefficient. Similarly the input signals for other DkCE elements are processed in the consecutive clock cycles.

Further efficiency can be achieved by taking advantage of MULT1 and MULT2 being idle in very first two clock cycles. Therefore, the system may compute $s_{i,j}*q$ in one of these clock cycles. It can safely allocate the input signal $s_{i,j}$ from outside by selecting SEL=0 and the filter coefficient q to MULT1. In the second clock cycle, 0 is allocated to the filter coefficient input of MULT2, resulting in a 0 output into ADD7 40. Alternatively, the outside input of the sample $s_{i,j}$ could be loaded into both multipliers with the filter coefficient being set as q/2.

The specific example of FIG. 5 can be expanded to a more general method of operating a symmetric digital filter having dimensions N×N. In general, there will be at least one multiplier. The multiplier will multiply a sum of incoming sample signals, such as SCEs, SMEs or DCEs, with a filter coefficient. The sums used as inputs for the multiplier will result from the binary tree adder. As each sum multiplied by the appropriate filter coefficient, the products are accumulated in an accumulation adder. Finally, all the products are summed, resulting in the filtered output.

A flowchart of one embodiment of a method for operating a digital filter is shown in FIG. 3. At 40, the square corner elements and square middle elements are processed, as mentioned above. During the initial two clock cycles, or at some point before the multipliers become busy from the adders used for processing the SCEs and SMEs, the central element is also processed by multiplying the central sample by the central element of the filter coefficient at 46.

At 42, any distance corner elements are processed. In smaller filter kernels, there are not distance corner elements. For example, referring back to the filter kernel for a 3×3 filter, there are no DCEs. However, if there were DCEs, these would be processed at 42. Finally, the filtered output is summed at 44, resulting in a filtered signal.

None of the above specific examples are intended to limit the scope of the invention, but are set forth for discussion purposes only. For example, allocation of SCEs to the inputs of the adders before the SMEs is merely an implementation and in no way limits the scope of the invention. The SMEs could be loaded into the adders prior to the SCEs.

Thus, although there has been described to this point a particular embodiment for a method and apparatus for an optimally timed symmetric digital filter, it is not intended that such specific references be considered as limitations upon the scope of this invention except in-so-far as set forth in the following claims.

What is claimed is:

1. A symmetric separable digital filter having the dimensions N rows by N columns of coefficients decomposed into a plurality of squares of coefficients and a central element, comprising:
   a binary tree adder operable to produce sums of samples of an incoming signal;
   a multiplier operable to multiple sums from the binary tree adder with filter coefficients producing filtered products; and
   an accumulation adder operable to sum filtered products and produce a filtered output.

2. The digital filter of claim 1, wherein N is equal to one of the following group of integers: 3, 5, 7, 9, 11, 13, and 15.

3. The digital filter of claim 1, wherein the filtered output is obtained in a number of clock cycles substantially equal to the quantity (N squared plus 3) divided by 2.

4. The digital filter of claim 1, wherein the sums produced include sums of samples associated with single corner coefficients.

5. The digital filter of claim 1, wherein the sums produced include sums samples associated with of single middle coefficients.

6. The digital filter of claim 1, wherein the sums produced include sums of samples associated with distance corner coefficients.

7. The digital filter of claim 1, wherein the multiplier is also operable to multiply a central sample by a central coefficient.

8. The digital filter of claim 1, wherein N is substantially equal to five and the binary tree adder is comprised of four adders in a first stage and two adders in a second stage.

9. A symmetric separable digital filter having the dimensions N rows by N columns of coefficients decomposed into a plurality of squares of coefficients and a central element, comprising:
   a binary tree adder operable to produce sums of samples of an incoming signal;
   a multiplier operable to multiply sums from the binary tree adder with filter coefficients producing filtered products;
   a multiplexer operable to select inputs for the multiplier;
   an accumulation adder operable to sum filtered products and produce a filtered output.

10. The digital filter of claim 9 wherein the filter produces the filtered output in (N squared plus 31) divided by 8 clock cycles.

11. The digital filter of claim 9 wherein the multiplexer provides the multiplier with the central element of the filter coefficients and a central element of the incoming signal during the first two clock cycles.

12. A method of executing a digital filter having dimensions N rows by N columns, the method comprising:
   processing coefficients of an incoming signal decomposed into a plurality of squares of coefficients and a central element, wherein square corner elements and square middle elements of an incoming signal are processed, wherein processing includes summing square corner elements into a square corner element sum and summing square middle elements into a square middle element sum;
   processing any distance corner elements of an incoming signal, wherein processing includes summing distance corner elements into a distance corner element sum;
   multiplying the square corner element sum, the square middle element sum and the square distance element sum by the appropriate filter coefficient; and
   multiplying a central element of the incoming signal with a central element of a coefficient kernel during the processing of the square corner elements and the square middle elements.

13. The method of claim 11, wherein N is less than or equal to 3 and there are no distance corner elements.

14. The method of claim 11, wherein N is greater than 3 and there are distance corner elements.

15. The method of claim 11, wherein the method includes multiplexing the multiplier inputs between the central element and the sums.

* * * * *

UNITED STATES PATENT AND TRADEMARK OFFICE
CERTIFICATE OF CORRECTION

PATENT NO. : 6,751,640 B1
DATED : June 15, 2004
INVENTOR(S) : Acharya

It is certified that error appears in the above-identified patent and that said Letters Patent is hereby corrected as shown below:

Column 9,
Line 11, "to multiple sums" should read -- to multiply sums --.

Signed and Sealed this

Fourteenth Day of December, 2004

JON W. DUDAS
*Director of the United States Patent and Trademark Office*